(12) United States Patent
Knechtel

(10) Patent No.: US 8,129,255 B2
(45) Date of Patent: Mar. 6, 2012

(54) FIRM, INSULATING AND ELECTRICALLY CONDUCTING CONNECTION OF PROCESSED SEMICONDUCTOR WAFERS

(75) Inventor: Roy Knechtel, Geraberg (DE)

(73) Assignee: X-Fab Semiconductors Foundries AG, Erfurt (DE)

(*) Notice: Subject to any disclaimer, the term of this patent is extended or adjusted under 35 U.S.C. 154(b) by 523 days.

(21) Appl. No.: 10/595,303

(22) PCT Filed: Oct. 29, 2004

(86) PCT No.: PCT/DE2004/002413
§ 371 (c)(1),
(2), (4) Date: May 19, 2006

(87) PCT Pub. No.: WO2005/042401
PCT Pub. Date: May 12, 2005

(65) Prior Publication Data
US 2008/0029878 A1    Feb. 7, 2008

(30) Foreign Application Priority Data
Oct. 29, 2003   (DE) .................................. 103 50 460

(51) Int. Cl.
*H01L 21/46*    (2006.01)
(52) U.S. Cl. ............... 438/455; 438/456; 257/E21.598; 257/E21.705

(58) Field of Classification Search .......... 438/455–456; 257/704, E21.211, E23.193, E21.598, E21.705
See application file for complete search history.

(56) References Cited

U.S. PATENT DOCUMENTS
5,094,969 A * 3/1992 Warren ........................... 29/830
(Continued)

FOREIGN PATENT DOCUMENTS
DE           3837300           5/1990
(Continued)

OTHER PUBLICATIONS
"Solder" dictionary entry, Academic Press Dictionary of Science and Technology, 1992.*
(Continued)

*Primary Examiner* — Kevin Parendo
(74) *Attorney, Agent, or Firm* — Hunton & Williams LLP

(57) ABSTRACT

The invention relates to a process for and an arrangement of the connection of processed semiconductor wafers (1, 2) wherein, in addition to the firm connection, there is an electric connection (5) between the semiconductor wafers and/or the electronic structures (3) supporting them. For this purpose, low-melting structured intermediate glass layers (6; 6*a*) are used as insulating layers and as an electric connection in the form of electrically conductive solder (5) on a glass basis in order to achieve a firm connection.

11 Claims, 2 Drawing Sheets

U.S. PATENT DOCUMENTS

| | | | |
|---|---|---|---|
| 5,164,328 | A | 11/1992 | Dunn et al. |
| 5,545,912 | A * | 8/1996 | Ristic et al. .................. 257/417 |
| 5,955,771 | A | 9/1999 | Kurtz et al. |
| 6,020,646 | A | 2/2000 | Boyle et al. |
| 6,046,121 | A | 4/2000 | Masuko et al. |
| 6,183,871 | B1 | 2/2001 | Lee et al. |
| 6,517,399 | B1 | 2/2003 | Ito et al. |
| 6,555,414 | B1 * | 4/2003 | Vanfleteren et al. .......... 438/108 |
| 6,817,917 | B1 * | 11/2004 | Kado et al. ..................... 445/25 |
| 2002/0086456 | A1 | 7/2002 | Cunningham et al. |
| 2003/0170936 | A1 * | 9/2003 | Christensen et al. ......... 438/151 |
| 2004/0142540 | A1 * | 7/2004 | Kellar et al. .................. 438/455 |

FOREIGN PATENT DOCUMENTS

| | | |
|---|---|---|
| DE | 4006108 | 8/1991 |
| DE | 19616014 | 10/1997 |
| DE | 10141753 | 3/2003 |
| EP | 0 886 144 A | 12/1998 |
| EP | 0886144 | 12/1998 |
| GB | 2312553 | 10/1997 |
| JP | 09-219423 | 8/1997 |
| JP | 2000-114409 | 4/2000 |

OTHER PUBLICATIONS

Jin Y, et al., "Mems Vacuum Packaging Technology and Applications", Electronic Packaging Technology, 2003 5$^{th}$ Conference (EPTC 2003) Dec. 10-12, 2003, Piscataway, NJ, USA, IEEE, Dec. 10, 2003, pp. 301-306.
Kadar, Zsolt: "Integrated Resonant Magnetic Field", *Delft University Press*, Netherlands, Copyright © Feb. 1997.
Jin, Y. et al.: "MEMS Vacuum Packaging Technology and Applications", 2003 Electronics Packaging Conference, Dec. 10-12, 2003, Piscataway, NJ, pp. 301-306.
International Search Report—Form PCT/ISA/210, mailed Mar. 22, 2005.
"Glass transition temperature" retrieved from Internet—http://plastic.inwiki.org/Glass_transition_temperature—dated Jun. 1, 2009 (modified).
Ferro Electronic Material Systems, "Hybrid Microcircuit Materials 11-036, 11-155, 11-201 Sealing Glass Pastes", dated Oct. 2007 pp. 1-2.
Central Glass Co., Ltd. Web Page, downloaded on Feb. 26, 2011 at: http://www.cgc-jp.com/products/electronicglass/fritpaste.html.
Schott North America Web Page, downloaded on Feb. 28, 2011 at: http://www.us.schott.com/epackaging/english/glass/technical_powder/solder.html.

* cited by examiner

(Schnitt A-A von Fig. 2)  section A-A of Figure 2

FIRM, INSULATING AND ELECTRICALLY CONDUCTING CONNECTION OF PROCESSED SEMICONDUCTOR WAFERS

The invention relates to a process for connecting processed semiconductor wafers by means of electrically conducting and electrically insulated, structured intermediate connecting layers. A wafer arrangement that can be produced with the process is also involved.

The connecting of processed semiconductor wafers is used in the manufacture of microelectronic and microelectromechanical systems in order to cover specific structures already during the wafer process by a cap. On the one hand, this operation is necessary in order to protect sensitive mechanical structures during subsequent processing steps and/or to implement the actual encapsulation of the individual elements, e.g. optical components, already during wafer bonding and to thus make special structures possible. Customary processes for connecting e.g. system and cover wafers are anodic and direct bonding and bonding by means of low-melting intermediate glass layers (glass frit bonding).

As a rule, the mechanically and/or electrically active elements are located on the system wafer. Whereas the cover layer mostly only serves as a covering protection (cap) and does not have any electrical structures or only has a few electrical structures according to the prior art.

The aforementioned bonding processes have the property that the wafers are not conductingly connected with each other. On the one hand, this is due to the fact that the cover wafer itself is not conducting (anodic bonding). On the other hand, intermediate layers formed during bonding are not conducting (binding oxide during direct bonding, intermediate glass layer during glass frit bonding). When using the encapsulation bonding it is, however, mostly necessary to specifically connect the entire cover and/or structures on the cover in an electrically conducting fashion. An electric connection of the entire cover is partly necessary in order to connect it to a specific potential, e.g. mass.

For the reading of capacitive sensors evaluation electrodes are required on the cover which must have a contact towards the system wafer in order to make a wire bonding during the setting up and connection processes in one plane possible.

To increase the packing density of Microsystems it is also advantageous to integrate evaluation circuits on the cover wafer, if they can have an electric contact towards the system wafer. So far, electric wafer-to-wafer contacts have only been known so far from anodic bonding. Here, metallization areas of the wafers to be connected are brought into mechanical contact and are firmly pressed together due to the resultant wafer connection force, cf. KADAR et al., Sensors & Actuators A52 (1996), pages 151 to 155—Aluminium press-on contacts for glass to silicon anodic bonding.

This process is not completely convincing. On the one hand, the areas of electric contact interfere with the formation of the actual wafer bond connection. On the other hand, there is no material connection in the area of the electric contacts so that their reliability is thus doubtful. The glass frit bonding is considered to be the wafer bonding process for encapsulation purposes that can be used most universally, since it renders very high bonding yields and since, due to the planarizing effect of the molten intermediate glass layer, it balances surface profiles of the wafers to be connected and, thus, makes lateral metallic contact leadthroughs in the bonding interface possible.

The invention is based on the technical object of designing a connection process in such a way that a firm connection that tightly seals with respect to cavities of at least two semiconductor wafers is provided with a simultaneous electric connection of the wafers.

The object is attained with claims 1, 11 or 10 or 20 (as a process and a product). the combination of conducting and insulating glass structures specifically reaches areas of the cover wafer during glass frit bonding so that they are electrically connected.

The invention is especially suited for microelectromechanical structures which are integrated with structures of the evaluation electronics. Moreover, more than two semiconductor wafers can also be connected with each other as a stack. Then, there are also central areas in this stack, where cover wafer and system wafer may be present at the same time.

The invention is explained and supplemented by means of examples with two semiconductor wafers using the drawing.

Figure 1:
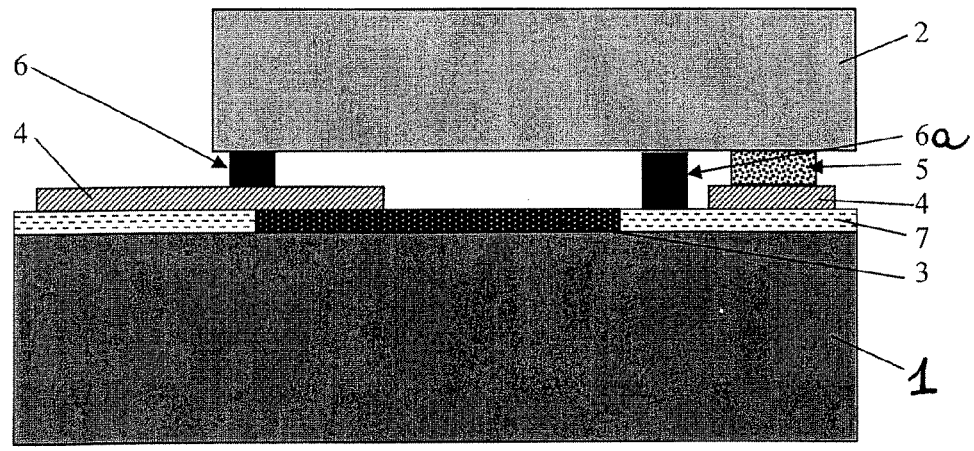
FIG. 1 is a system wafer 1 which was connected with a cover wafer 2 according to an example of a process, namely as a schematic section along line/plane A-A of FIG. 2.

As it is shown in FIG. 1, low-melting, structured insulating intermediate glass layers 6, 6a, 6b and the electrically conductive solder 5 on the basis of glass (glass paste) connect the system wafer 1 with the cover wafer 2, a selective contacting of the cover wafer 2 with the system wafer 1 and/or between electrically active structures 3 of both wafers being established at the same time (as a product and/or as a process).

As regards the process, the application and the premelting of both glass solders 6, 5 can be implemented separately and successively. Here, the application and premelting of the first glass solder 6 (as a structured layer) is implemented and, separately and, after a certain time interval has expired, the application and premelting of the second glass solder 5 is implemented.

However, an application that takes place successively and a joint premelting are possible, in particular in the temperature range of 450° C.

A conditioning of the glass pastes in the customary extent and the customary processes in semiconductor technology take place prior to a premelting.

The conducting and non-conducting wafer connections are e.g. formed at the same time in the bonding process. For this, the processing temperatures of both used glasses are in the same range.

Metallic strip conductors 4 which are located on the system wafer 1 and are insulated with respect to the substrate by means of an intermediate insulator 7 can be embedded in the area of the non-conducting glass solder. This makes the low-impedance connection of the structures 3 that are to be protected with the cover 2 possible. At the same time, the structures that must be covered by the cover can be packed in a hermetically tight fashion.

The wafer connection 6, 6a, 6b which is mainly mechanically supporting can be implemented by means of a glass solder. As regards it thermal expansion it adapts very good to silicon. The electric contact surfaces must be kept small in order to minimize mechanical stresses.

Figure 2:
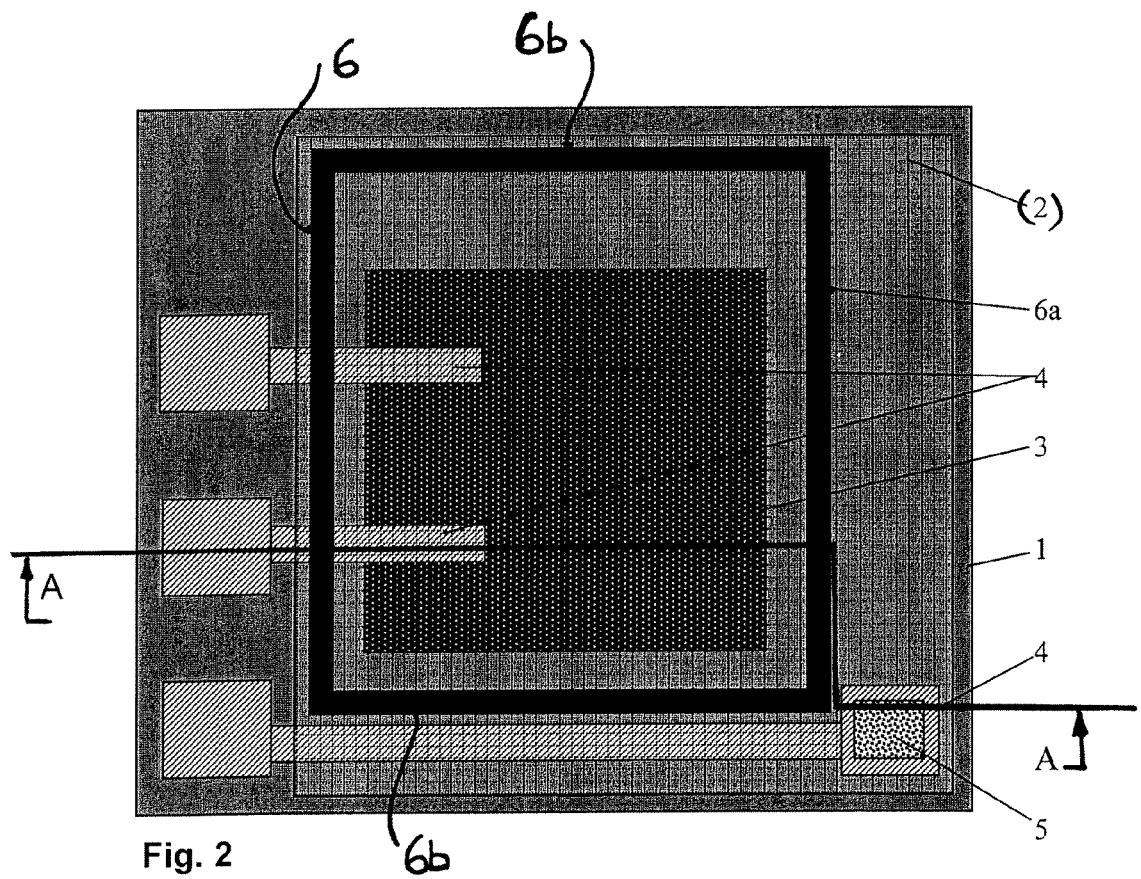
FIG. 2 is a top view of an arrangement as it is shown in FIG. 1.

In the top view of FIG. 2 the sectional line A is plotted which, provided with a step results in the sectional view of FIG. 1. The cover 2 as the cover wafer is only shown symbolically, actually removed, in FIG. 2, in order to be able to have a look at the structures located beneath it. The wafer 2 is provided with a checked pattern, is unequivocally allocated to FIG. 1 as regards its marginal areas and covers the structure 3 to be protected, but reveals, at the same time, the hermetic sealing and the mechanical support by the isolator layer (the structured layer 6a, 5b, 6) which is set up in a frame-shaped fashion. The bonding islands and the strip conductors 4 can also be reocognized in this picture outside and below the cover wafer 2.

Figure 3:
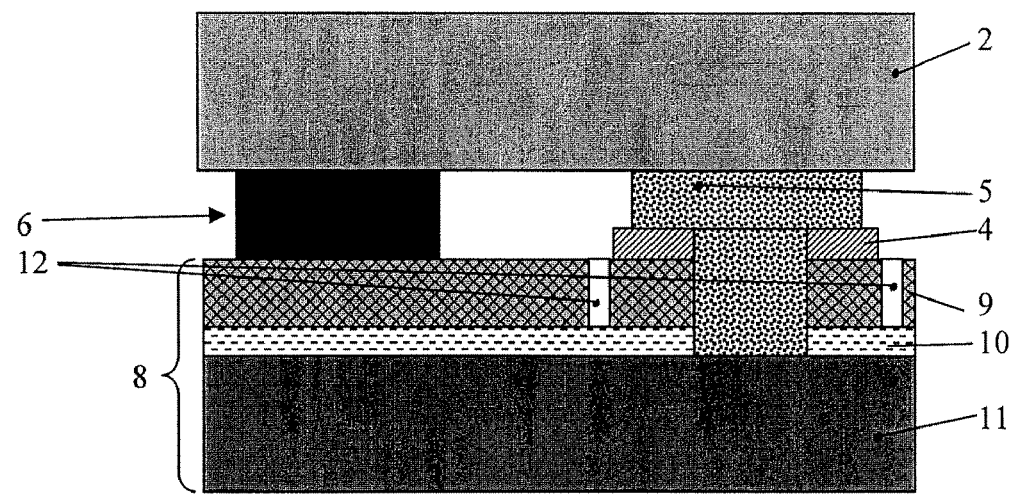
FIG. 3 is a variant of a conducting connection between system wafer and cover wafer.

If SOI wafers 8 (silicon on insulator) are used as system wafers as is shown in FIG. 3, there is the possibility to electrically connect substrate 11 of the SOI wafer by means of the conducting glass solder 5. For this purpose, the active layer 9 of the SOI substrate and the buried oxide 10 must be opened at the corresponding site so that the electrically conducting glass solder 5 can flow into the opening and thus contact the carrier wafer.

In order to connect only one or the desired points of the active semiconductor layer 9, the semiconductor layer 9 is insulated at the perforated walls. An intermediate insulator 7, cf. FIG. 1, is not shown in FIG. 3. Since the current SOI-based technologies include these partial steps, there is no extra expenditure.

Figure 4:
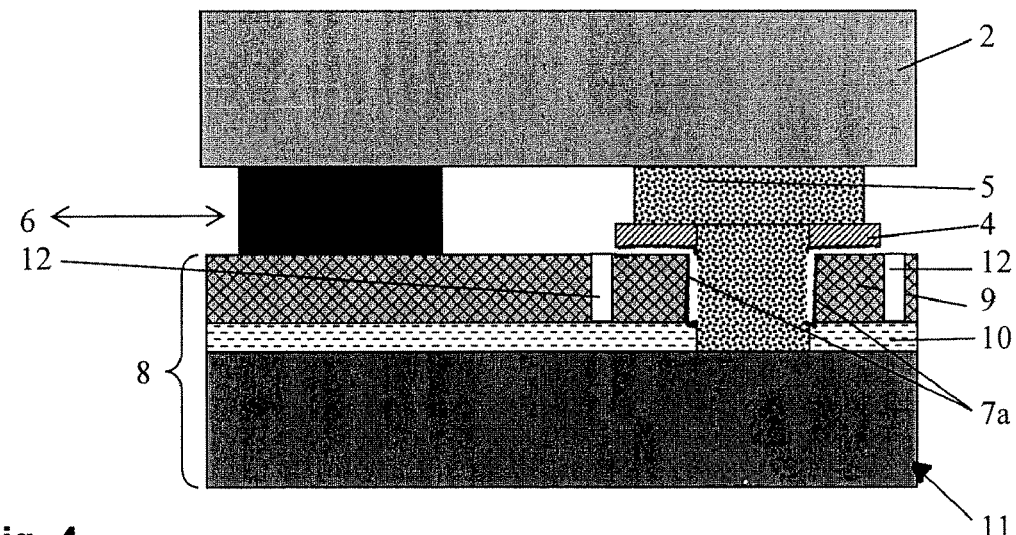
FIG. 4 is a further variant of a conducting connection between system wafer and cover wafer analogously to FIG. 3.

In a variant to FIG. 3, which was already described there implicitly, but which is completely shown in FIG. 4, the intermediate insulator 7a is defined as regards its area within the opening occupied by the conducting glass solder 5, which, however, does not penetrate up to the semiconductor layer 9 so that it contacts it, since an in particular cylindrical insulator layer 7a is provided which, resting on the top of the semiconductor layer 9, may still have a circumferential edge in a round, cornered or differently shaped fashion. The strip conductor 4 is only provided above this edge and the semiconductor layer 9. Moreover, the design according to FIG. 4 is designed in the same way as that in FIG. 3 so that reference is made to the description thereof.

If the corresponding electric contact areas and the necessary wafer connection frames are taken into consideration in the design of system wafer 1 and cover wafer 2, the following process for producing the electrically conducting and insulating wafer connections is e.g. possible:

screen printing for applying the electrically non-conducting glass paste 6 on the cover wafer 2;
conditioning and premelting of the electrically non-conducting glass paste 6;
screen printing for applying the electrically conducting glass paste 5 on the cover wafer,
conditioning and premelting of the electrically conducting glass paste;
aligning of system and cover wafers;
bonding under mechanical pressure at the processing temperature of the glasses and/or glass pastes 5, 6.

Alternatively the application of the glasses and/or glass pastes may also be carried out in the reverse order and/or on the system wafer 1 with correspondingly adapted further process steps as shown above.

LIST OF REFERENCE NUMERALS

1 System wafer with microelectromechanical and/or electronic structures 3
2 Cover wafer, in particular also provided with electronic structures
3 Microelectromechanical and/or electronic structures to be protected
4 Metal structures, feed lines and bonding islands (bonding pads)
5 Electrically conductive connecting glass (first glass paste, structured)
6 Electrically insulating connecting glass (second glass paste, structured)
7 Intermediate insulating layer
8 SOI wafer (silicon on insulator)
9 Silicon layer (active layer) supporting active electronic structures
7a Insulation in the opening of the active layer
10 Buried oxide of the SOI wafer
11 Supporting wafer (substrate)
12 Insulating ducts in the active layer 9

I claim:

1. A process wherein at least two processed semiconductor wafers having electrically active structures thereon that are located in a central area of a stack of wafers, and wherein in an operation of a mechanical connecting, electrically insulating connections and electrically conductive connections are produced between said at least two processed semiconductor wafers each one thereof having a wafer surface to be connected, said process comprising:
providing an electrically non-conducting glass paste and an electrically conducting glass paste;
applying patterned layers of the electrically non-conducting glass paste and the electrically conducting glass paste on said wafer surfaces;
thereafter conditioning and pre-melting the electrically non-conducting glass paste and the electrically conducting glass paste;
thereafter providing geometrical alignment of the at least two processed semiconductor wafers to be connected; and
thereafter bonding the at least two processed semiconductor wafers at a first processing temperature of the electrically non-conducting glass paste and at a second processing temperature of the electrically conducting glass paste using a mechanical pressure.

2. The process according to claim 1, wherein the electrically non-conducting glass paste and the electrically conducting glass paste are applied by a screen printing process.

3. The process according to claim 1, wherein the electrically non-conducting glass paste and the electrically conducting glass paste have different conditioning conditions and pre-melting conditions and, therefore, the conditioning and the pre-melting are implemented successively, each in a separate conditioning and pre-melting process.

4. The process according to claim 1, wherein the first processing temperature of the electrically non-conducting glass paste and the second processing temperature of the electrically conducting glass paste are the same processing temperature.

5. The process according to claim 1, wherein the first processing temperature of the electrically non-conductive glass paste and the second processing temperature of the electrically conducting glass paste are different processing temperatures and wherein the first processing temperature and the second processing temperature are successively passed in the process of bonding the at least two processed semiconductor wafers.

6. The process according to claim 1, wherein at least one of the at least two processed semiconductor wafers has an electrical connection in an area that does not contain electronic structures.

7. The process according to claim 1, wherein the at least two processed semiconductor wafers are electrically connected at specific electric circuit points in areas containing electronic structures.

8. The process according to claim 1, wherein the joining of the at least two processed semiconductor wafers further comprises the first processing temperature and the second processing temperature being about 450° C.

9. The process according to claim 1, wherein one of the at least two processed semiconductor wafers is a SOI wafer comprising an active semiconductor layer and a buried oxide layer on a substrate and wherein an electrical connection to the substrate of the SOI wafer is implemented through previously produced openings in the buried oxide layer and in the active semiconductor layer.

10. The process according to claim 1, wherein the applying of the patterned layers comprises applying a first patterned layer of the electrically non-conducting glass paste to the wafer surface of a first one of the at least two processed semiconductor wafers and applying a second patterned layer of the electrically conducting glass paste on the wafer surface of a second of the at least two processed semiconductor wafers.

11. A process wherein at least two processed semiconductor wafers having electrically active structures thereon that are located in a central area of a stack of wafers, and wherein in an operation of a mechanical connecting, electrically insulating connections and electrically conductive connections are produced between said at least two processed semiconductor wafers, each one thereof having a wafer surface to be connected, said process comprising:

providing an electrically non-conducting glass paste and an electrically conducting glass paste;

applying a patterned layer of the electrically non-conducting glass paste on said wafer surfaces;

thereafter conditioning and pre-melting the electrically non-conducting glass paste on said wafer surfaces;

applying a patterned layer of the electrically conducting glass paste on said wafer surfaces;

thereafter conditioning and pre-melting the electrically conducting glass paste on said wafer surfaces;

thereafter providing geometrical alignment of the at least two processed semiconductor wafers to be connected; and thereafter bonding the at least two processed semiconductor wafers at a first processing temperature of the electrically non-conducting glass paste and at a second processing temperature of the electrically conducting glass pastes using a mechanical pressure.

* * * * *

UNITED STATES PATENT AND TRADEMARK OFFICE
CERTIFICATE OF CORRECTION

| | | |
|---|---|---|
| PATENT NO. | : 8,129,255 B2 | |
| APPLICATION NO. | : 10/595303 | |
| DATED | : March 6, 2012 | |
| INVENTOR(S) | : Knechtel | |

It is certified that error appears in the above-identified patent and that said Letters Patent is hereby corrected as shown below:

Title page Item (73) should read:

--(73) Assignee:  X-Fab Semiconductor Foundries AG
                  Erfurt (DE)--

Signed and Sealed this
Twenty-ninth Day of May, 2012

David J. Kappos
*Director of the United States Patent and Trademark Office*